United States Patent
Moon

(10) Patent No.: US 8,115,230 B2
(45) Date of Patent: Feb. 14, 2012

(54) LIGHT EMITTING DEVICE, LIGHT EMITTING DEVICE PACKAGE AND LIGHTING SYSTEM

(75) Inventor: Yong Tae Moon, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 12/940,718

(22) Filed: Nov. 5, 2010

(65) Prior Publication Data

US 2011/0147771 A1 Jun. 23, 2011

(30) Foreign Application Priority Data

Dec. 18, 2009 (KR) .......................... 10-2009-0127189

(51) Int. Cl.
*H01L 31/00* (2006.01)
*H01L 31/0256* (2006.01)

(52) U.S. Cl. ..... 257/103; 257/96; 257/76; 257/E25.032; 257/E31.105

(58) Field of Classification Search .................... 257/76, 257/96, 103, E23.032, E31.105
See application file for complete search history.

(56) References Cited

U.S. PATENT DOCUMENTS

| | | | | |
|---|---|---|---|---|
| 7,629,615 | B2 * | 12/2009 | Ichinose et al. | 257/76 |
| 7,842,966 | B2 * | 11/2010 | Watanabe et al. | 257/103 |
| 2005/0110037 | A1 * | 5/2005 | Takeda et al. | 257/103 |
| 2006/0223287 | A1 | 10/2006 | Ushida et al. | |
| 2007/0131951 | A1 * | 6/2007 | Ikemoto et al. | 257/94 |
| 2008/0142795 | A1 | 6/2008 | Ichinose et al. | |

FOREIGN PATENT DOCUMENTS

| | | |
|---|---|---|
| EP | 1653502 A1 | 5/2006 |
| JP | 2005-072094 A | 3/2005 |
| JP | 2009-91217 A | 4/2009 |
| KR | 10-2008-0001844 A | 1/2008 |
| KR | 10-2008-0049869 A | 6/2008 |
| KR | 10-2008-0068244 A | 7/2008 |
| KR | 10-2009-0053407 A | 5/2009 |

* cited by examiner

*Primary Examiner* — Zandra Smith
*Assistant Examiner* — Tsz Chiu
(74) *Attorney, Agent, or Firm* — Birch, Stewart, Kolasch & Birch, LLP

(57) ABSTRACT

Disclosed are a light emitting device, a light emitting device package, and a lighting system. The light emitting device includes an oxide including gallium aluminum over a gallium oxide substrate, a nitride including gallium aluminum over the oxide including gallium aluminum, and a light emitting structure over the nitride including gallium aluminum.

7 Claims, 4 Drawing Sheets

【FIG. 1】
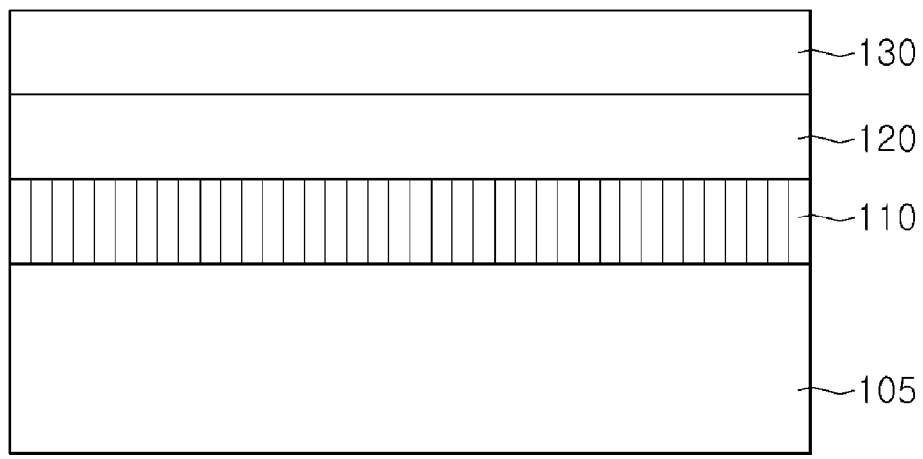
【FIG. 2】
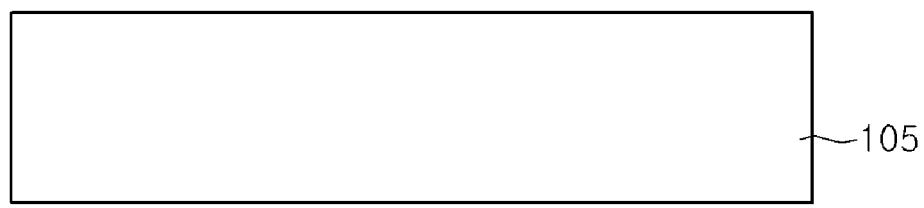
【FIG. 3】
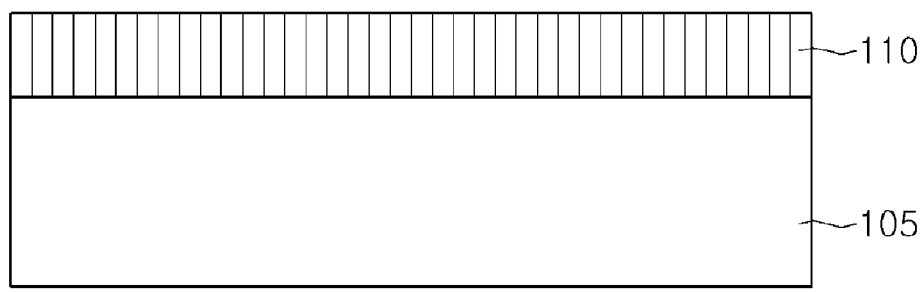

[FIG. 4]
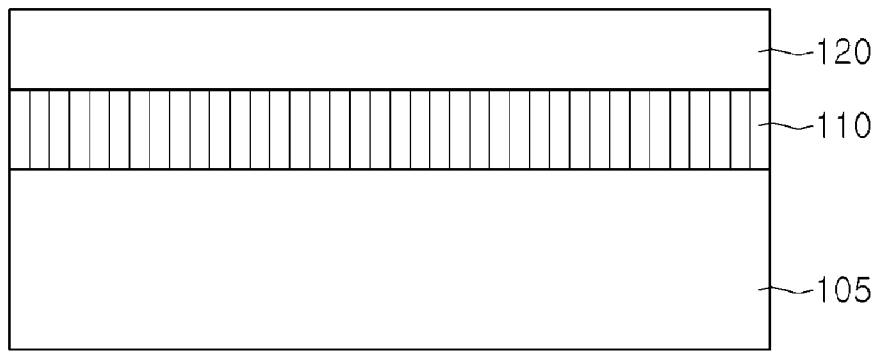
[FIG. 5]
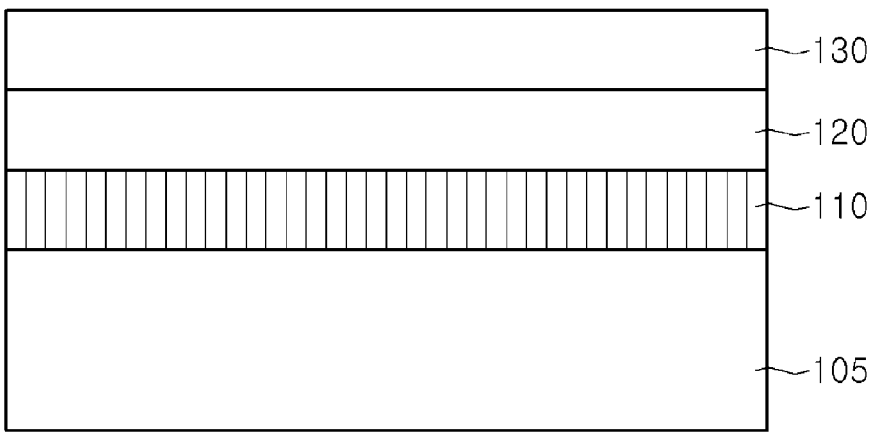
[FIG. 6]
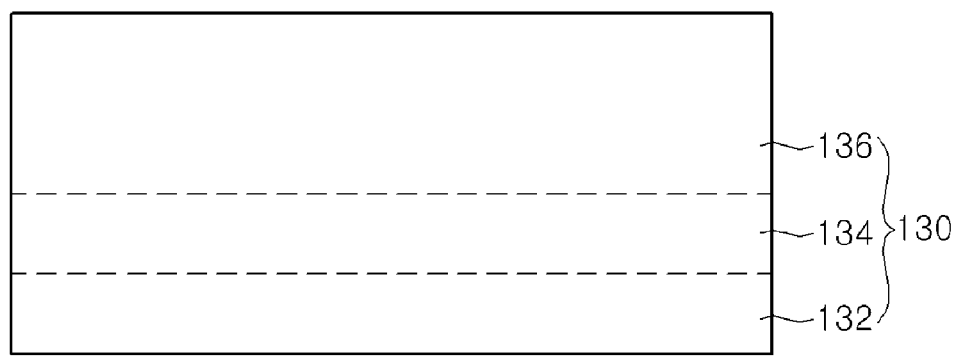

[FIG. 7]
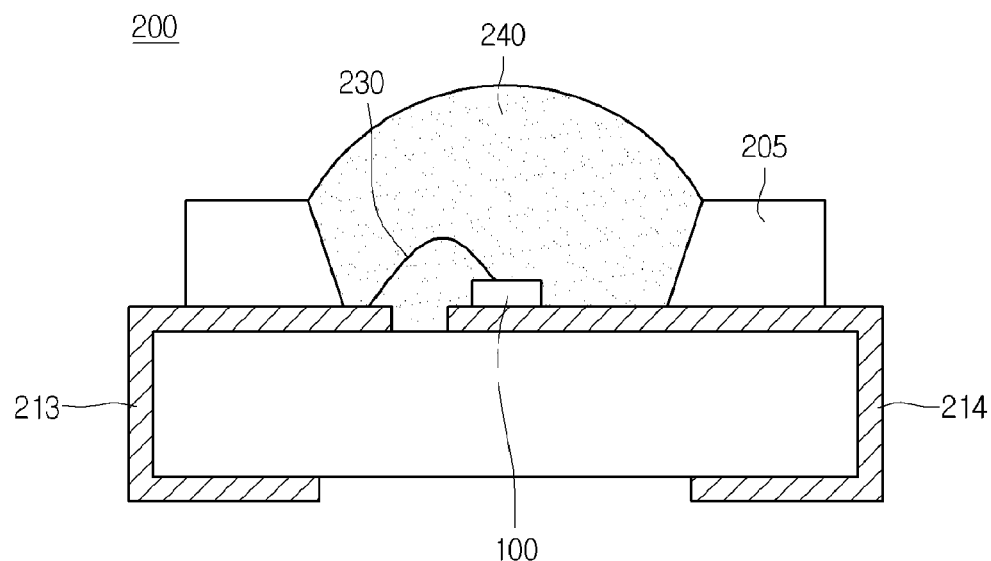
[FIG. 8]
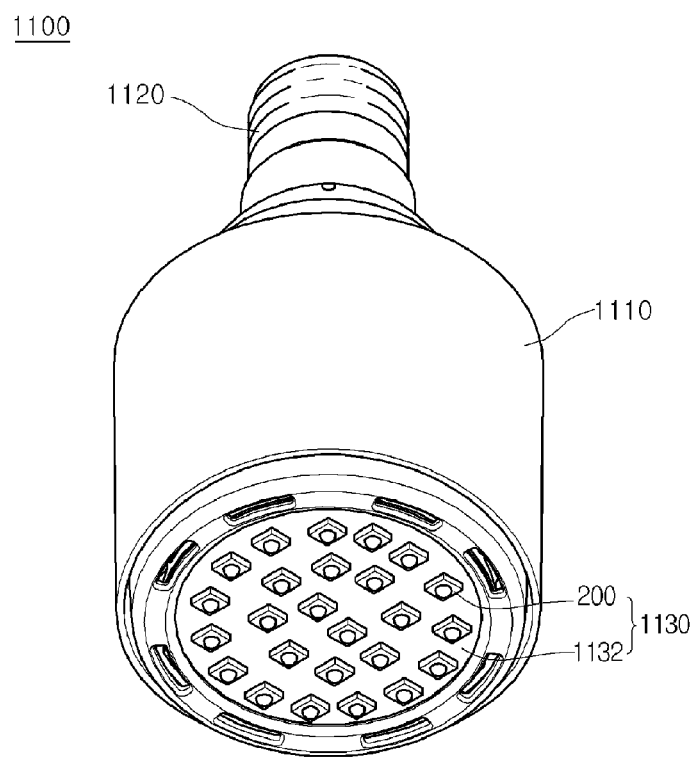

[FIG. 9]
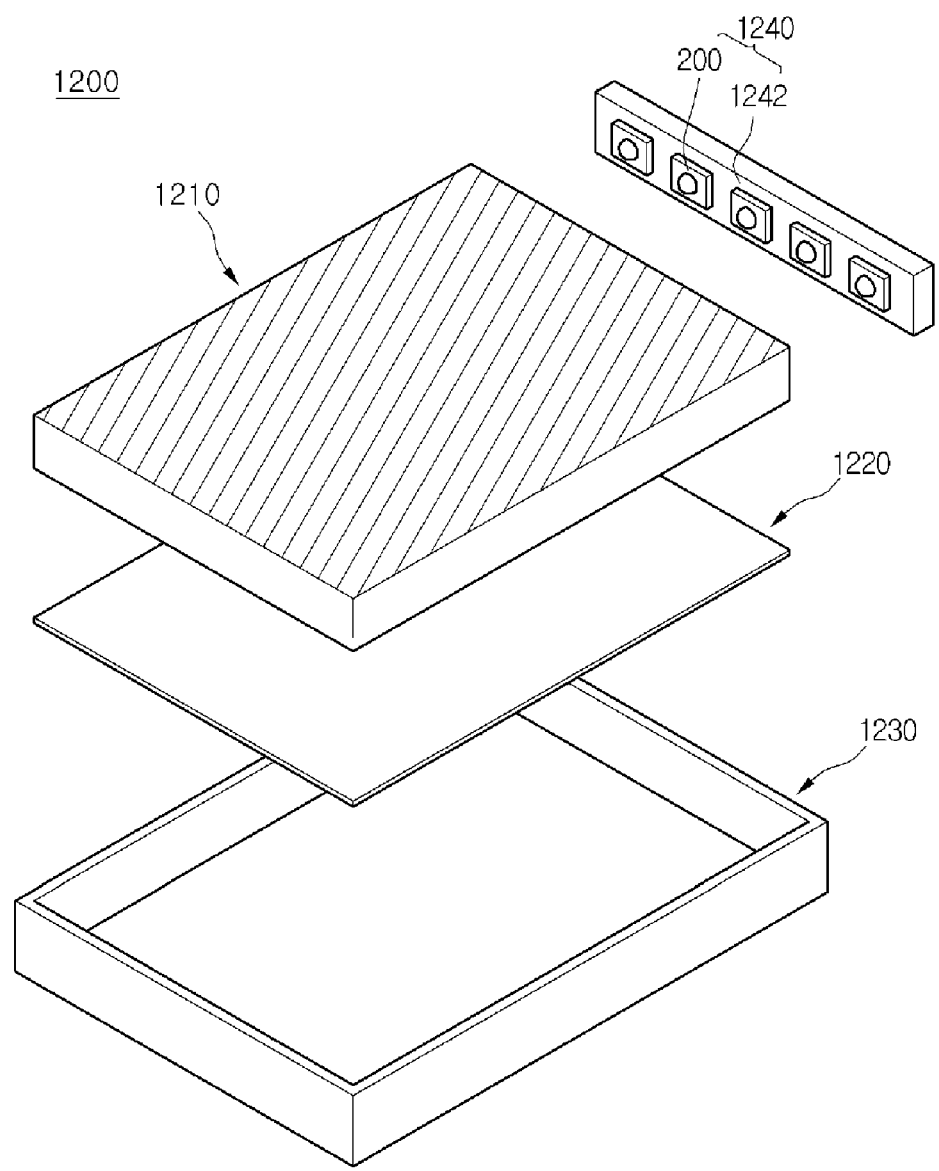

LIGHT EMITTING DEVICE, LIGHT EMITTING DEVICE PACKAGE AND LIGHTING SYSTEM

CROSS-REFERENCE TO RELATED APPLICATION

This application claims under 35 U.S.C. §119 to Korean Patent Application No. 10-2009-0127189 filed Nov. 2, 2009, which is hereby incorporated by reference.

BACKGROUND

The embodiment relates to a light emitting device, a light emitting device package, and a lighting system.

A light emitting device (LED) includes a p-n junction diode having a characteristic of converting electric energy into light energy. The p-n junction diode can be formed by combining group III and V elements of the periodic table. The LED can represent various colors by adjusting the compositional ratio of compound semiconductors.

When forward voltage is applied to the LED, electrons of an n layer are bonded with holes of a p layer, so that energy corresponding to an energy gap between a conduction band and a valance band may be generated. This energy is mainly realized as heat or light, and the LED emits the energy as the light.

A nitride semiconductor represents superior thermal stability and wide band gap energy, so the nitride semiconductor has been spotlighted in the field of optical devices and high-power electronic devices. In particular, blue, green, and UV light emitting devices employing the nitride semiconductor have already been developed and extensively used.

Meanwhile, a light emitting device including the nitride semiconductor can be classified into a lateral type light emitting device and a vertical type light emitting device according to positions of electrode layers.

However, the vertical type light emitting device has a difficulty in the manufacturing process because a non-conductive substrate has to be separated after the nitride semiconductor has been formed over the non-conductive substrate such as a sapphire substrate. Accordingly, researches and studies have been actively carried out toward a nitride semiconductor light emitting device that does not require the separation of a substrate by using a conductive substrate when the vertical type light emitting device is manufactured.

For example, according to the related art, a nitride semiconductor layer may be formed over a gallium oxide substrate.

However, according to the related art, the nitride semiconductor layer may be delaminated from the gallium oxide substrate.

For example, the gallium oxide is easily etched at a high temperature hydrogen gas atmosphere, but the nitride semiconductor layer is grown at a high-temperature atmosphere of the mixture of ammonia gas and hydrogen gas. Therefore, when the nitride semiconductor layer is grown, a portion of the interface between the gallium oxide substrate and the nitride semiconductor layer is irregularly etched by hydrogen gas at a high temperature. The irregular etching of the interface degrades the adhesive strength of the interface, thereby causing the delamination between the nitride semiconductor layer and the gallium oxide substrate.

In addition, the gallium oxide substrate has a thermal expansion coefficient different from that of the nitride semiconductor layer. Accordingly, when the nitride semiconductor layer is cooled after the nitride semiconductor layer has been grown, or when a heat treatment process is performed in order to manufacture the light emitting device, the delamination may be caused at the interface between the gallium oxide substrate and the nitride semiconductor layer due to the stress caused by the difference in the thermal expansion coefficient between the gallium oxide substrate and the nitride semiconductor layer.

BRIEF SUMMARY

The embodiment provides a nitride semiconductor light emitting device capable of representing high performance by realizing a high-quality nitride semiconductor layer over a gallium oxide substrate, a light emitting device package, and a lighting system.

According to the embodiment, a light emitting device includes an oxide including gallium aluminum over a gallium oxide substrate, a nitride including gallium aluminum over the oxide including gallium aluminum, and a light emitting structure over the nitride including gallium aluminum.

According to the embodiment, the light emitting device package includes a package body, third and fourth electrode layers installed over the package body, and a light emitting device electrically connected to the third and fourth electrode layers.

According to the embodiment, the lighting system includes a substrate, and a light emitting module including a light emitting device package installed over the substrate. The light emitting device package includes a package body, third and fourth electrode layers installed over the package body, and a lighting emitting device according to claim 1 and electrically connected to the third and fourth electrode layers.

BRIEF DESCRIPTION OF THE DRAWINGS

FIG. 1 is a sectional view showing a light emitting device according to the embodiment;

FIGS. 2 to 6 are sectional views showing a method of manufacturing the light emitting device according to the embodiment;

FIG. 7 is a sectional view showing a light emitting device package according to the embodiment;

FIG. 8 is a perspective view showing a lighting unit according to the embodiment; and FIG. 9 is an exploded perspective view showing a backlight unit according to the embodiment.

DETAILED DESCRIPTION OF THE EMBODIMENTS

Hereinafter, a light emitting device, a light emitting device package, and a lighting system according to the embodiment will be described with reference to accompanying drawings.

In the description of embodiments, it will be understood that when a layer (or film) is referred to as being 'on' another layer or substrate, it can be directly over another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Embodiment

FIG. 1 is a sectional view showing a light emitting device 100 according to the embodiment.

The light emitting device 100 may include a gallium aluminum oxide 110 over a gallium oxide substrate 105, a gallium aluminum nitride 120 over the gallium aluminum oxide 110, and a light emitting structure 130 over the gallium aluminum nitride 120.

The gallium aluminum oxide 110 may include $Ga_xAl_yO_z$ ($0<x\leq1$, $0<y\leq1$, $0<z\leq1$), but the embodiment is not limited thereto.

The gallium aluminum nitride 120 may include $Ga_xAl_yN_z$ ($0<x\leq1$, $0<y\leq1$, $0<z\leq1$), but the embodiment is not limited thereto.

The light emitting structure 130 may include a second conductive semiconductor layer 132 over the gallium aluminum nitride 120, an active layer 134 over the second conductive semiconductor layer 132, and a first conductive semiconductor layer 136 over the active layer 134, but the embodiment is not limited thereto.

According to the embodiment, the bond strength between gallium (Ga) and oxygen (O) is stronger than the bond strength between aluminum (Al) and oxygen (O), and the bond strength between gallium (Ga) and nitrogen (N) is stronger than the bond strength between aluminum (Al) and nitrogen (N).

Accordingly, the interfacial adhesion between the gallium aluminum oxide 110 and the gallium aluminum nitride 120 is stronger than that between the gallium oxide substrate and the light emitting structure 130 including a nitride semiconductor layer. Accordingly, the light emitting structure 130 can be prevented from being delaminated from the gallium oxide substrate 105. The interfacial adhesion between the gallium aluminum oxide 110 and the gallium aluminum nitride 120 is stronger than that between gallium oxide/gallium nitride and the nitride semiconductor layer, so that delamination can be prevented.

According to the light emitting device and a method of manufacturing the same according to the embodiment, as the interfacial adhesion between the gallium oxide substrate and the nitride semiconductor layer is enhanced, the nitride semiconductor layer having high quality can be realized, so that a light emitting device having superior reliability and performance can be realized.

Hereinafter, the method of manufacturing the light emitting device 100 according to the embodiment will be described with reference to FIGS. 2 to 6.

As shown in FIG. 2, the gallium oxide substrate 105 is prepared. The gallium oxide substrate 105 may include a conductive substrate. The gallium oxide substrate 105 may include a $Ga_2O_3$ substrate, but the embodiment is not limited thereto.

The gallium oxide substrate 105 may have superior electrical conductivity through the doping of impurities.

A wet cleaning process is performed with respect to the gallium oxide substrate 105 to remove organic and inorganic materials from the gallium oxide substrate 105.

As shown in FIG. 3, the gallium aluminum oxide 110 is formed over the gallium oxide substrate 105. The gallium aluminum oxide 110 may include $Ga_xAl_yO_z$ ($0<x\leq1$, $0<y\leq1$, $0<z\leq1$), but the embodiment is not limited thereto.

Since the bond strength between atoms is strongly represented in the gallium aluminum oxide 110, great energy gap is represented. Accordingly, since the gallium aluminum oxide 110 may have electrical conductivity less than that of the gallium oxide substrate 105, the gallium aluminum oxide 110 may be formed at a thickness of 1 or less, but the embodiment is not limited thereto.

In order to form the gallium aluminum oxide 110, a deposition process may be performed with respect to the top surface of the gallium oxide substrate 105 by using a thin film deposition device. For example, the gallium aluminum oxide 110 may be formed through liquid-phase epitaxy, vapor phase epitaxy, molecular beam epitaxy, or sputtering.

In order to form the gallium aluminum oxide 110, an aluminum layer (not shown) is formed over the gallium oxide substrate 105. Thereafter, heat treatment is performed with respect to the resultant structure at an oxygen atmosphere, so that Al atoms of the aluminum layer are diffused into the gallium oxide substrate 105, thereby forming the gallium aluminum oxide 110.

For example, after an Al thin film layer has been formed over the gallium oxide substrate 105, oxygen gas or mixture gas mainly containing oxygen gas is injected into a chamber and heat treatment is performed with respect to the gallium oxide substrate 105 at a temperature of about 500° C. to 1200° C., thereby forming the gallium aluminum oxide 110. However, the embodiment is not limited thereto.

Thereafter, as shown in FIG. 4, the gallium aluminum nitride 120 is formed over the gallium aluminum oxide 110.

The gallium aluminum nitride 120 may include $Ga_xAl_yN_z$ ($0<x\leq1$, $0<y\leq1$, $0<z\leq1$), but the embodiment is not limited thereto.

The gallium aluminum nitride 120 may be formed over the gallium aluminum oxide 110 by using a thin film deposition device. For example, the gallium aluminum nitride 120 may be formed through liquid-phase epitaxy, vapor phase epitaxy, molecular beam epitaxy, or sputtering, but the embodiment is not limited thereto.

The gallium aluminum nitride 120 may be formed by nitrifying a portion of the gallium aluminum oxide 110.

For example, an aluminum layer (not shown) is formed over the gallium oxide substrate 105. Thereafter, heat treatment is performed with respect to the resultant structure at an oxygen atmosphere, so that Al atoms of the aluminum layer are diffused into the gallium oxide substrate 105, thereby forming the gallium aluminum oxide 110. Next, the gallium aluminum oxide 110 is nitrified at a high temperature and at an ammonia atmosphere, so that the gallium aluminum nitride 120 can be formed.

The high-temperature nitrification can be performed by injecting ammonia gas, the mixture of ammonia gas and oxygen gas, or the mixture of ammonia gas and nitrogen gas into a chamber.

In this case, impurity gas is injected into the chamber, so that the electrical conductivity of the gallium aluminum nitride 120 can be improved.

According to the embodiment, the bond strength between gallium (Ga) and oxygen (O) is stronger than that between aluminum (Al) and oxygen (O), and the bond strength between gallium (Ga) and nitrogen (N) is stronger than that between aluminum (Al) and nitrogen (N).

Accordingly, the interfacial adhesion between the gallium aluminum oxide 110 and the gallium aluminum nitride 120 is stronger than that between the gallium oxide substrate 105 and the light emitting structure 130 including a nitride semiconductor layer. Therefore, the delamination between the gallium oxide substrate 105 and the light emitting structure 130 can be prevented.

According to the light emitting device and the method of manufacturing the same according to the embodiment, as the interfacial adhesion between the gallium oxide substrate and the nitride semiconductor layer is enhanced, the nitride semiconductor layer having high quality can be realized, so that a light emitting device having superior reliability and performance can be realized.

Then, the light emitting structure 130 may be formed over the gallium aluminum nitride 120 as shown in FIG. 5. FIG. 6 is an enlarged view showing a portion of the light emitting structure 130.

The light emitting structure 130 may include the second conductive semiconductor layer 132 formed over the gallium aluminum nitride 120, the active layer 134 formed over the second conductive semiconductor layer 132, and the first conductive semiconductor layer 136 formed over the active layer 134, but the embodiment is not limited thereto.

The first conductive semiconductor layer 136 may include group III-V compound semiconductors doped with first conductive dopants. When the first conductive semiconductor layer 136 is an N type semiconductor layer, the first conductive dopants may include Si, Ge, Sn, Se, or Te as N type dopants, but the embodiment is not limited thereto.

The first conductive semiconductor layer 136 may include a semiconductor material having a composition formula of $In_xAl_yGa_{1-x-y}N$ ($0 \leq x \leq 1$, $0 \leq y \leq 1$, $0 \leq x \leq 1$).

The first conductive semiconductor layer 136 may include at least one selected from the group consisting of InN, AlN, InGaN, AlGaN, InAlGaN, AlInN, AlGaAs, InGaAs, AlInGaAs, GaP, AlGaP, InGaP, AlInGaP, and InP.

The first conductive semiconductor layer 136 may include an N type GaN layer through CVD (chemical vapor deposition), MBE (molecular beam epitaxy), sputtering, or HVPE (hydride vapor phase epitaxy). In addition, the first conductive semiconductor layer 136 may be formed by injecting trimethyl gallium (TMGa) gas, ammonia ($NH_3$) gas, nitrogen ($N_2$) gas, or silane ($SiH_4$) gas including N type impurities such as Si into a chamber.

The active layer 134 emits a light having energy determined by an intrinsic energy band of materials constituting the active layer (light emitting layer) through the combination of electrons injected through the first conductive semiconductor layer 136 and holes injected through the second conductive semiconductor layer 132.

The active layer 134 may have one of a SQW (single quantum well) structure, an MQW (multi-quantum well) structure, a quantum-wire structure, or a quantum dot structure. For example, the active layer 134 may have the MQW structure by injecting TMGa gas, $NH_3$ gas, $N_2$ gas or TMIn gas, but the embodiment is not limited thereto.

The active layer 134 may have a well/barrier layer including at least one of InGaN/GaN, InGaN/InGaN, GaN/AlGaN, InAlGaN/GaN, GaAs (InGaAs)/AlGaAs and GaP (InGaP)/AlGaP, but the embodiment is not limited thereto. The well layer may include a material having the band gap energy lower than that of the barrier layer.

A conductive clad layer (not shown) can be formed over and/or under the active layer 134. The conductive clad layer may include an AlGaN-based semiconductor having the band gap energy higher than that of the active layer 134.

The second conductive semiconductor layer 132 may include the group III-V compound semiconductor doped with the second conductive dopant. For instance, the second conductive semiconductor layer 132 may include the semiconductor material having the composition formula of $In_xAl_yGa_{1-x-y}N$ ($0 \leq x \leq 1$, $0 \leq y \leq 1$, $0 \leq x+y \leq 1$). In detail, the second conductive semiconductor layer 132 may include one selected from the group consisting of GaN, AlN, AlGaN, InGaN, InN, InAlGaN, AlInN, AlGaAs, GaP, GaAs, GaAsP, and AlGaInP. If the second conductive semiconductor layer 132 is a P type semiconductor layer, the second conductive dopant includes the P type dopant such as Mg, Zn, Ca, Sr, or Ba. The second conductive semiconductor layer 132 can be prepared as a single layer or a multiple layer, but the embodiment is not limited thereto.

The second conductive semiconductor layer 132 may include a P type GaN layer, which can be formed by injecting TMGa gas, $NH_3$ gas, $N_2$ gas and ($EtCp_2Mg$) {Mg ($C_2H_5C_5H_4)_2$} gas including p type impurities (for example, Mg) into the chamber, but the embodiment is not limited thereto.

According to the embodiment, the first conductive semiconductor layer 136 may include an N type semiconductor layer and the second conductive semiconductor layer 136 may include a P type semiconductor layer. The first conductive semiconductor layer 136 may include a P type semiconductor layer and the second conductive semiconductor layer 136 may include an N type semiconductor layer.

In addition, a semiconductor layer, such as an N type semiconductor layer (not shown) having polarity opposite to that of the second conductive semiconductor layer 132, can be formed over the second conductive semiconductor layer 132. Thus, the light emitting structure 130 may include one of an N—P junction structure, a P—N junction structure, an N—P—N junction structure, and a P—N—P junction structure.

Thereafter, a second electrode (not shown) may be formed under the gallium oxide substrate 105, and a first electrode (not shown) may be formed over the first conductive semiconductor layer 136.

The second electrode may include an ohmic layer (not shown), a reflective layer (not shown), or a conductive support substrate (not shown).

For example, the second electrode may include an ohmic layer, and may have a multi-stack structure of single metal, metallic alloy, or metallic oxide such that hole injection can be efficiently performed.

For example, the ohmic layer may include at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IZON (IZO Nitride), AGZO (Al—Ga ZnO), IGZO (In—Ga ZnO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf, but the embodiment is not limited thereto.

For example, the reflective layer may include a metal or a metal alloy including at least one selected from the group consisting of Ag, Ni, Al, Rh, Pd, Ir, Ru, Mg, Zn, Pt, Au, and Hf. In addition, the reflective layer can be prepared as a multiple layer by using the above metal or metal alloy and transmissive conductive material, such as IZO, IZTO, IAZO, IGZO, IGTO, AZO, or ATO. For instance, the reflective layer may have the stack structure including IZO/Ni, AZO/Ag, IZO/Ag/Ni, AZO/Ag/Ni.

In addition, a conductive support substrate may include at least one selected from the group consisting of copper (Cu), a Cu alloy, gold (Au), nickel (Ni), molybdenum (Mo), copper-tungsten (Cu—W), and a carrier wafer (for example, Si, Ge, GaAs, GaN, ZnO, SiGe, or SiC wafer).

According to the light emitting device of the embodiment, as the interfacial adhesion between the gallium oxide substrate and the nitride semiconductor layer is enhanced, the nitride semiconductor layer having high quality can be realized, so that a light emitting device having superior reliability and performance can be realized.

FIG. 7 is a view showing a light emitting device package 200 including the light emitting device 100 according to the embodiment.

Referring to FIG. 7, the light emitting device package 200 according to the embodiment includes a package body 205, third and fourth electrode layers 213 and 214 formed over the package body 205, the light emitting device 100 provided over the package body 205 and electrically connected to the third and fourth 213 and 214 and a molding member 240 that surrounds the light emitting device 100.

The package body 205 may include silicon, synthetic resin or metallic material. An inclined surface may be formed around the light emitting device 100.

The third and fourth electrode layers 213 and 214 are electrically isolated from each other to supply power to the light emitting device 100. In addition, the third and fourth electrode layers 213 and 214 reflect the light emitted from the light emitting device 100 to improve the light efficiency and dissipate heat generated from the light emitting device 100 to the outside.

The vertical type light emitting device shown in FIG. 1 can be employed as the light emitting device 100, but the embodiment is not limited thereto.

The light emitting device 100 can be installed over the package body 205 or the third and fourth electrode layers 213 and 214.

The light emitting device 100 is electrically connected to the third electrode layer 213 and/or the fourth electrode layer 214 through at least one of a wire bonding scheme, a flip chip bonding scheme and a die bonding scheme. According to the embodiment, the light emitting device 100 is electrically connected to the third electrode layer 213 through a wire 230 and electrically connected to the fourth electrode layer 214 through the die bonding scheme.

The molding member 240 surrounds the light emitting device 100 to protect the light emitting device 100. In addition, the molding member 240 may include phosphors to change the wavelength of the light emitted from the light emitting device 100.

A plurality of light emitting device packages according to the embodiment may be arrayed over a substrate, and an optical member including a light guide plate, a prism sheet, a diffusion sheet or a fluorescent sheet may be provided over the optical path of the light emitted from the light emitting device package. The light emitting device package, the substrate, and the optical member may serve as a backlight unit or a lighting unit. For example, the lighting system may include a backlight unit, a lighting unit, an indicator, a lamp or a streetlamp.

FIG. 8 is a perspective view showing a lighting unit 1100 according to the embodiment. The lighting unit 1100 shown in FIG. 9 is an example of a lighting system, and the embodiment is not limited thereto.

Referring to FIG. 8, the lighting unit 1100 includes a case body 1110, a light emitting module 1130 installed in the case body 1110, and a connection terminal 1120 installed in the case body 1110 to receive power from an external power source.

Preferably, the case body 1110 includes material having superior heat dissipation property. For example, the case body 1110 includes metallic material or resin material.

The light emitting module 1130 may include a substrate 1132 and at least one light emitting device package 200 installed over the substrate 1132.

The substrate 1123 includes an insulating member printed with a circuit pattern. For instance, the substrate 1132 includes a PCB (printed circuit board), an MC (metal core) PCB, an F (flexible) PCB, or a ceramic PCB.

In addition, the substrate 1132 may include material that effectively reflects the light. The surface of the substrate 1132 can be coated with a color, such as a white color or a silver color, to effectively reflect the light.

At least one light emitting device package 200 can be installed over the substrate 1132. Each light emitting device package 200 may include at least one light emitting device 100. The light emitting device 100 may include a colored LED that emits the light having the color of red, green, blue or white and a UV (ultraviolet) LED that emits UV light.

The light emitting device packages 200 of the light emitting module 1130 can be variously arranged to provide various colors and brightness. For example, the white LED, the red LED and the green LED can be arranged to achieve the high color rendering index (CRI).

The connection terminal 1120 is electrically connected to the light emitting module 1130 to supply power to the light emitting module 1130. The connection terminal 1120 has a shape of a socket screw-coupled with the external power source, but the embodiment is not limited thereto. For example, the connection terminal 1120 can be prepared in the form of a pin inserted into the external power source or connected to the external power source through a wire.

FIG. 9 is an exploded perspective view showing a backlight unit 1200 according to the embodiment. The backlight unit 1200 shown in FIG. 9 is an example of a lighting system and the embodiment is not limited thereto.

The backlight unit 1200 according to the embodiment includes a light guide plate 1210, a light emitting module 1240 for providing the light to the light guide plate 1210, a reflective member 1220 positioned under the light guide plate, and a bottom cover 1230 for receiving the light guide plate 1210, light emitting module 1240, and the reflective member 1220 therein, but the embodiment is not limited thereto.

The light guide plate 1210 diffuses the light to provide surface light. The light guide 1210 includes transparent material. For example, the light guide plate 1210 can be manufactured by using acryl-based resin, such as PMMA (polymethyl methacrylate), PET (polyethylene terephthalate), PC (polycarbonate), COC (cycloolefin copolymer) or PEN (polyethylene naphthalate) resin.

The light emitting module 1240 supplies the light to the lateral side of the light guide plate 1210 and serves as the light source of the display device including the backlight unit.

The light emitting module 1240 can be positioned adjacent to the light guide plate 1210, but the embodiment is not limited thereto. In detail, the light emitting module 1240 includes a substrate 1242 and a plurality of light emitting device packages 200 installed over the substrate 1242 and the substrate 1242 can be adjacent to the light guide plate 1210, but the embodiment is not limited thereto.

The substrate 1242 may include a printed circuit board (PCB) having a circuit pattern (not shown). In addition, the substrate 1242 may also include a metal core PCB (MCPCB) or a flexible PCB (FPCB) in addition to the PCB, but the embodiment is not limited thereto.

In addition, the light emitting device packages 200 are arranged such that light exit surfaces of the light emitting device packages 200 are spaced apart from the light guide plate 1210 at a predetermined distance.

The reflective member 1220 is disposed under the light guide plate 1210. The reflective member 1220 reflects the light, which travels downward through the bottom surface of the light guide plate 1210, toward the light guide plate 1210, thereby improving the brightness of the backlight unit. For example, the reflective member 1220 may include PET, PC or PVC resin, but the embodiment is not limited thereto.

The bottom cover 1230 may receive the light guide plate 1210, the light emitting module 1240, and the reflective member 1220 therein. To this end, the bottom cover 1230 has a box shape with an open top surface, but the embodiment is not limited thereto.

The bottom cover 1230 can be manufactured through a press process or an extrusion process by using metallic material or resin material.

According to the light emitting device, the light emitting device package, and the lighting system of the embodiment, as the interfacial adhesion between the gallium oxide substrate and the nitride semiconductor layer is enhanced, the nitride semiconductor layer having high quality can be realized, so that a light emitting device having superior reliability and performance can be realized.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
    an oxide including gallium aluminum over a gallium oxide substrate;
    a nitride including gallium aluminum over the oxide including gallium aluminum; and
    a light emitting structure over the nitride including gallium aluminum.

2. The light emitting device of claim 1, wherein the oxide including gallium aluminum comprises $Ga_xAl_yO_z$ ($0<x\leq1$, $0<y\leq1$, $0<z\leq1$).

3. The light emitting device of claim 1, wherein the oxide including gallium aluminum has a thickness of 1 or less.

4. The light emitting device of claim 1, wherein the nitride including gallium aluminum comprises $Ga_xAl_yN_z$ ($0<x\leq1$, $0<y\leq1$, $0<z\leq1$).

5. The light emitting device of claim 1, wherein the light emitting structure comprises:
    a second conductive semiconductor layer over the nitride including gallium aluminum;
    an active layer over the second conductive semiconductor layer; and
    a first conductive semiconductor layer over the active layer.

6. A light emitting device package comprising:
    a package body;
    third and fourth electrode layers over the package body; and
    a light emitting device claimed in claim 1 and electrically connected to the third and fourth electrode layers.

7. A lighting system comprising:
    a substrate; and
    a light emitting module including a light emitting device package over the substrate,
    wherein the light emitting device package comprises a package body, third and fourth electrode layers over the package body, and a lighting emitting device claimed in claim 1 and electrically connected to the third and fourth electrode layers.

* * * * *